(12) United States Patent
Witczak et al.

(10) Patent No.: US 11,911,814 B2
(45) Date of Patent: Feb. 27, 2024

(54) METHOD OF FORMING AN ELONGATE ELECTRICAL CONNECTION FEATURE TRAVERSING A MICROSCOPIC STEP

(71) Applicant: XTPL S.A., Wroclaw (PL)

(72) Inventors: Łukasz Witczak, Łódź (PL); Piotr Kowalczewski, Łódź (PL); Aneta Wiatrowska, Wroclaw (PL); Karolina Fiączyk, Wroclaw (PL); Łukasz Kosior, Wroclaw (PL); Filip Granek, Mrozów (PL)

(73) Assignee: XTPL S.A., Wroclaw (PL)

( * ) Notice: Subject to any disclaimer, the term of this patent is extended or adjusted under 35 U.S.C. 154(b) by 410 days.

(21) Appl. No.: 17/391,633

(22) Filed: Aug. 2, 2021

(65) Prior Publication Data

US 2022/0040743 A1 Feb. 10, 2022

Related U.S. Application Data

(60) Provisional application No. 63/060,762, filed on Aug. 4, 2020.

(51) Int. Cl.
*B21C 23/00* (2006.01)
*H01L 33/62* (2010.01)
*B22F 3/20* (2006.01)

(52) U.S. Cl.
CPC .............. *B21C 23/005* (2013.01); *B22F 3/20* (2013.01); *H01L 33/62* (2013.01)

(58) Field of Classification Search
CPC ...... B21C 23/005; B22F 3/20; B22F 2999/00; B22F 1/0545; B22F 7/062; H01L 33/62; C22C 1/0458; C22C 5/06
See application file for complete search history.

(56) References Cited

U.S. PATENT DOCUMENTS

| | | | |
|---|---|---|---|
| 2016/0198576 A1* | 7/2016 | Lewis | B29C 64/106 361/761 |
| 2016/0365361 A1* | 12/2016 | Jiang | H01L 21/77 |
| 2018/0163071 A1* | 6/2018 | Fritz | H05K 3/10 |
| 2019/0054536 A1* | 2/2019 | Xu | B33Y 10/00 |
| 2019/0273061 A1* | 9/2019 | Mahajan | H01L 23/13 |
| 2021/0354361 A1* | 11/2021 | Kaczmarz | C09D 11/037 |
| 2022/0310397 A1* | 9/2022 | Witczak | B41M 1/22 |
| 2023/0183512 A1* | 6/2023 | Lysien | C09D 11/36 347/110 |

* cited by examiner

*Primary Examiner* — Victor A Mandala
(74) *Attorney, Agent, or Firm* — K&L Gates LLP

(57) ABSTRACT

A method of forming an elongate electrical connection feature that traverses at least one step on or in a substrate is disclosed. A metallic nanoparticle composition is extruded from a capillary tube while the capillary tube is displaced relative to the substrate. The method includes: (1) continuously extruding the composition from the capillary tube while displacing the capillary tube by a height increment during a displacement period; (2) continuously extruding the composition from the capillary tube while the capillary tube is stationary during a stationary period; and (3) repeatedly executing (1) and (2) until the capillary tube is displaced from a position at a step bottom portion to another position at a height not lower than a step top portion.

19 Claims, 13 Drawing Sheets

METHOD OF FORMING AN ELONGATE ELECTRICAL CONNECTION FEATURE TRAVERSING A MICROSCOPIC STEP

CROSS-REFERENCE TO RELATED APPLICATION

This application claims benefit under 35 U.S.C. § 119(e) to U.S. Provisional Application No. 63/060,762, filed Aug. 4, 2020, entitled "METHOD OF FORMING AN ELONGATE ELECTRICAL CONNECTION FEATURE TRAVERSING A MICROSCOPIC STEP," the entire disclosure of which is hereby incorporated by reference herein.

BACKGROUND

Recent progress in metallic nanoparticle compositions and printing apparatuses have enabled dispensing metallic nanoparticle compositions on substrates to form metallic nanoparticle lines having line widths in a range of about 2 µm to 20 µm. Metallic nanoparticles such as silver nanoparticles and copper nanoparticles can be used in these compositions. Wire-bonding is suitable for making electrical connections that traverse microscopic steps on a substrate. For example, wire-bonding can be used for some light-emitting diodes (LEDs). However, for micro-LEDs with lateral dimensions of 100 µm or less, wire-bonding is less desirable because the diameters of the wires are at least 15 µm. New technologies for forming electrical connections that traverse microscopic steps are desired. Such new technologies can be applied to making electrical connections to micro-LEDs.

SUMMARY OF THE INVENTION

In one aspect, a method of forming an elongate electrical connection feature traversing at least one microscopic step on or in a substrate is disclosed. The method includes the following steps: (A) continuously extruding a metallic nanoparticle composition from a capillary tube while displacing the capillary tube relative to the substrate from a first position to a second position; (B) extruding the metallic nanoparticle composition from the capillary tube while displacing the capillary tube relative to the substrate from the second position to a third position; and (C) continuously extruding the metallic nanoparticle composition from the capillary tube while displacing the capillary tube relative to the substrate from the third position to a fourth position. The first position and the second position are at a step bottom portion. The third position is at a height not lower than a step top portion. The fourth position is at a step top portion. The displacing during steps (A) and (C) are predominantly lateral. Step (B) includes the following sub-steps: (B1) continuously extruding the metallic nanoparticle composition from the capillary tube while displacing the capillary tube by a height increment during a displacement period; and (B2) continuously extruding the metallic nanoparticle composition from the capillary tube while the capillary tube is stationary during a stationary period; and (B3) repeatedly executing sub-steps (B1) and (B2) until the capillary tube reaches the third position.

In another aspect, elongate electrical connection feature traversing at least one microscopic step on or in a substrate includes a first portion overlying and contacting a step bottom portion; a second portion extending between the step bottom portion and a step top portion and contacting a sidewall of the microscopic step; and a third portion overlying and contacting a step top portion. The first portion, the second portion, and the third portion include metallic nanoparticles. At least one of the first portion, the second portion, and the third portion is characterized by a line width in a range of 2 µm to 30 µm and a height of the microscopic step is at least 10 µm.

In yet another aspect, a light-emitting assembly includes a substrate, a solid-state light-emitting element on or in the substrate, a conductive trace on or in the substrate, and an elongate electrical connection feature traversing at least one microscopic step between an electrode of the solid-state light-emitting element and the conductive trace. The elongate electrical connection feature includes a first portion overlying and contacting a step bottom portion, connected to the conductive trace; a second portion extending between the step bottom portion and a step top portion and contacting a sidewall of the microscopic step; and a third portion overlying and contacting a step top portion, connected to the electrode. The first portion, the second portion, and the third portion include metallic nanoparticles. At least one of the first portion, the second portion, and the third portion is characterized by a line width in a range of 2 µm to 30 µm and a height of the microscopic step is at least 10 µm.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to a method of forming an elongate electrical connection feature traversing at least one microscopic step on or in a substrate, an elongate electrical connection feature traversing at least one microscopic step on or in a substrate, and a light-emitting assembly.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
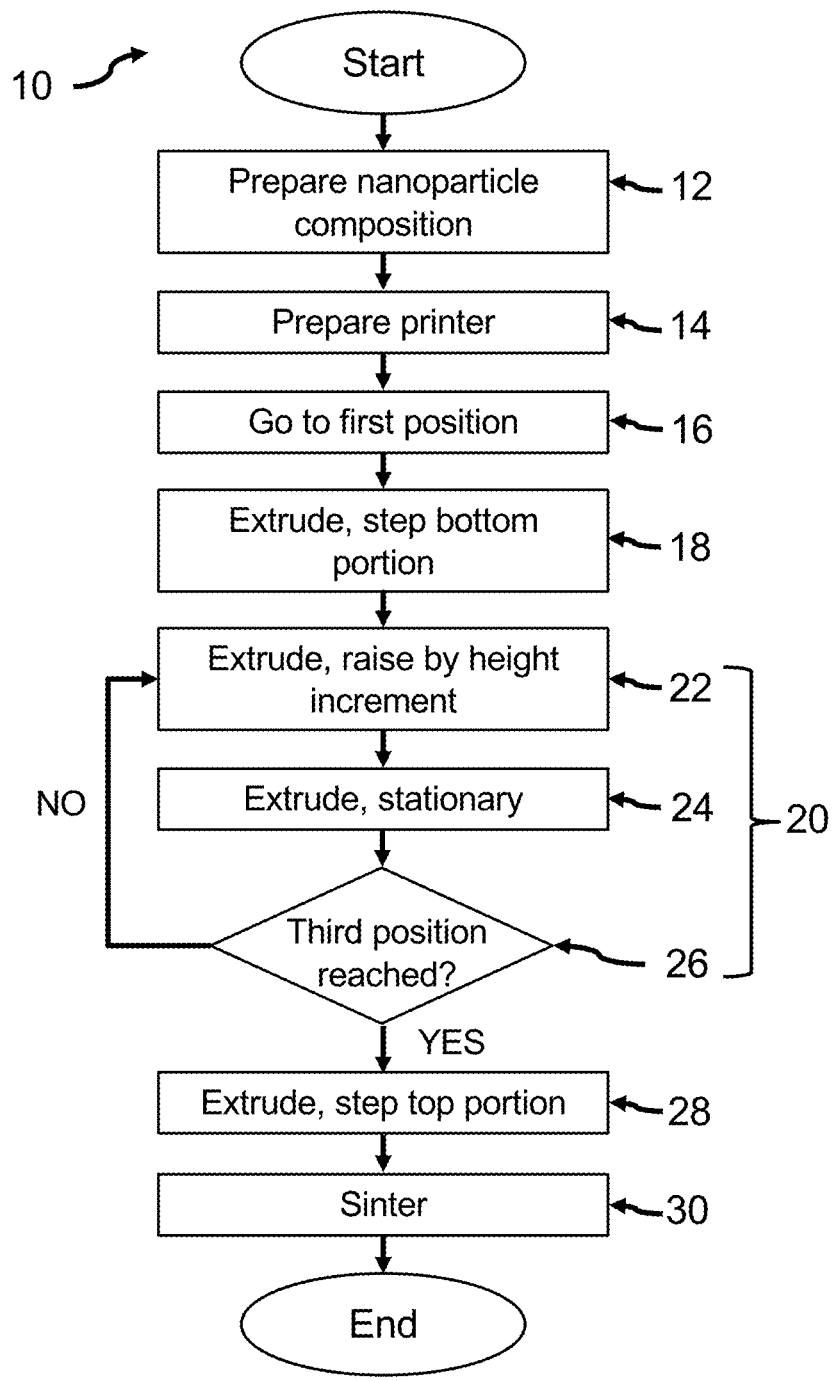
FIG. 1 is a flow diagram of a method of forming an elongate electrical connection feature according to a preferred embodiment.

FIG. 1 is a flow diagram of a method 10 of forming an elongate electrical connection feature (for convenience, sometimes referred to as a conductive feature) traversing a microscopic step on or in a substrate. For example, suppose that there is a solid-state light-emitting element (e.g., light-emitting diode (LED) or laser diode) on a substrate, with an electrode located on its top surface. The conductive feature can traverse a microscopic step between the electrode of the solid-state light-emitting element and a conductive trace on a substrate. In other cases, there may be a microscopic step in the substrate, between a surface of the substrate and a recess in the substrate. In the present disclosure, metallic nanoparticles are used to form the conductive features. Among various metallic nanoparticles, silver nanoparticles and copper nanoparticles are important because of the high electrical conductivity of silver and copper. For example, silver nanoparticles having an average particle size in a range of 20 nm to 80 nm, and copper nanoparticles having an average particle size in a range of 60 nm to 160 nm have been considered.

The method 10 includes steps 12, 14, 16, 18, 20, 28, and 30. Step 20 includes sub-steps 22, 24, and 26. At step 12, a metallic nanoparticle composition is prepared. This includes synthesizing metallic nanoparticles unless metallic nanoparticles are already available. Generally, the synthesis of metallic nanoparticles in solution employs three components: (1) metal precursors (e.g., $AgNO_3$ for silver nanoparticles and $Cu(NO_3)_2$ for copper nanoparticles); (2) reducing agents (e.g., ethylene glycol for silver nanoparticles and sodium hypophosphite for copper nanoparticles); and (3) stabilizing (capping) agents (e.g., polyvinylpyrrolidone). Polyvinylpyrrolidone, abbreviated as PVP, is soluble in water and other polar solvents. When PVP is effectively used as a dispersant, stable colloidal silver nanoparticles or copper nanoparticles covered (capped) with PVP polymer can be obtained in small size (<250 nm) because the PVP reduces the aggregation of the silver or copper nanoparticles.

The average size of the silver nanoparticles can be controlled to within a range of 20 nm to 80 nm. The average size of the copper nanoparticles can be controlled to within a range of 60 nm to 160 nm. The average particle size and dispersity can be controlled by controlling thermodynamic and kinetic reaction parameters. Reaction temperature, temperature ramp, and reaction time are the important thermodynamic reaction parameters. The rate of adding reagents and molar ratio of used metal precursor to stabilizing agent (PVP) are the important kinetic reaction parameters. An appropriate combination of these parameters leads to obtaining nanoparticles that exhibit the desired properties of small particles size, low dispersity, and high dispersion stability (low occurrence of aggregation).

Furthermore, at step 12, a metallic nanoparticle composition is made from the metallic nanoparticles. Generally, the nanoparticles are separated, to remove impurities and excess PVP, and dispersed in a solvent mixture including a first solvent and an optional second solvent. The metallic nanoparticle composition may optionally include additives to better control its physicochemical properties. These additives include surfactants, binders, adhesion promoters, and antifoaming agents. We have found that the concentration of such additives should not exceed 3% by weight in the metallic nanoparticle composition.

The preparation of an example composition is described in detail in the Example 1 hereinbelow. The Example 1 composition contains silver nanoparticles and triethylene glycol as a solvent. It has been found that solvents having a boiling point of at least 280° C. at a pressure of 760 mm Hg are preferable. In particular, triethylene glycol, which has a boiling point of 288° C. at a pressure of 760 mm Hg is preferable. On the other hand, it is preferable to reduce or avoid the use of lower-boiling point solvents having a boiling point of less than 280° C. at a pressure of 760 mm Hg. Examples of such lower-boiling point solvents are water, methanol, and ethanol. In a preferred metallic nanoparticle composition, a concentration, in aggregate, of solvents having a boiling point of less than 280° C. at a pressure of 760 mm Hg in the metallic nanoparticle composition does not exceed 3 wt %. In a preferred metallic nanoparticle composition, a concentration of solids (metallic nanoparticles including PVP capping layer) in the metallic nanoparticle composition is 80 wt % or greater. In the Example 1 composition, the concentration of silver nanoparticles solids is approximately 85 wt %.

Figure 2:
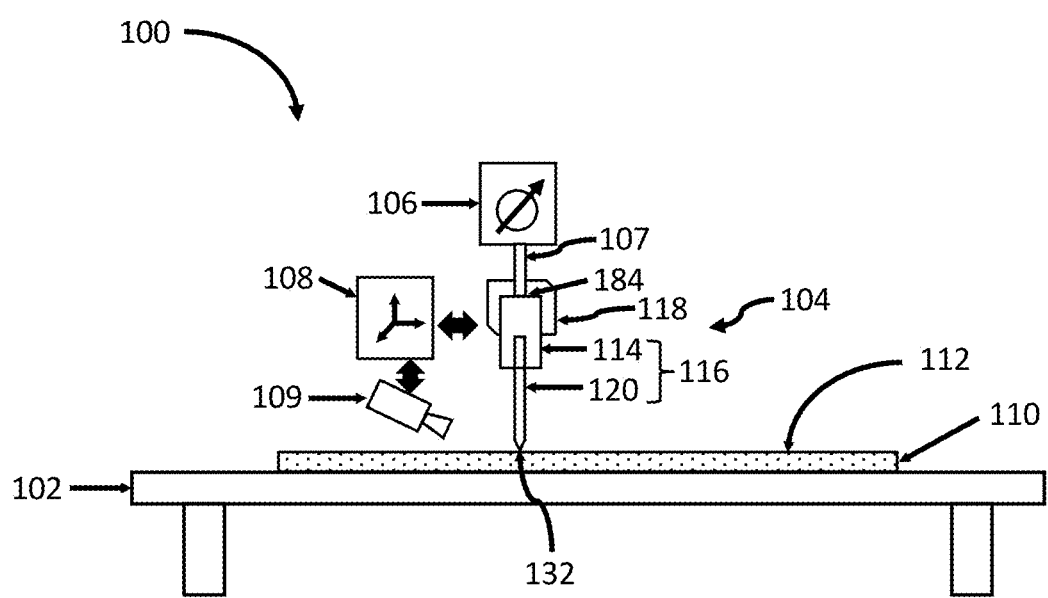
FIG. 2 is a block diagram view of an illustrative nanoparticle composition printing apparatus.

At step 14, a printing apparatus (printer) is prepared for use. FIG. 2 is a block diagram view of an illustrative printing apparatus. The printing apparatus 100 includes a substrate stage 102, a print head 104, a regulated pneumatic system 106, and a print head positioning system 108. The printing apparatus 100 can also include an imaging system 109, electronically coupled to the print head positioning system 108. A substrate 110 is fixed in position on the substrate stage 102 during the printing (dispensing) and has a printable surface 112, which is facing upward and facing towards the print head 104. The print head 104 is positioned above the substrate 110. The print head 104 includes a metallic nanoparticle composition dispenser 116 and a cartridge holder (dispenser holder) 118. The metallic nanoparticle composition dispenser 116 includes a piston-cylinder assembly 114 and a capillary tube 120, as described with reference to FIG. 9. Typically, the regulated pneumatic system 106 includes a pump and a pressure regulator. In the example shown in FIG. 2, a pneumatic port 184 of the piston cylinder assembly 114 is coupled to the regulated pneumatic system 106 via tubing 107. Preferably, the regulated pneumatic system 106 is capable of applying pressure in a range of 0 to 6 bar to the pneumatic port 184.

Figure 8:
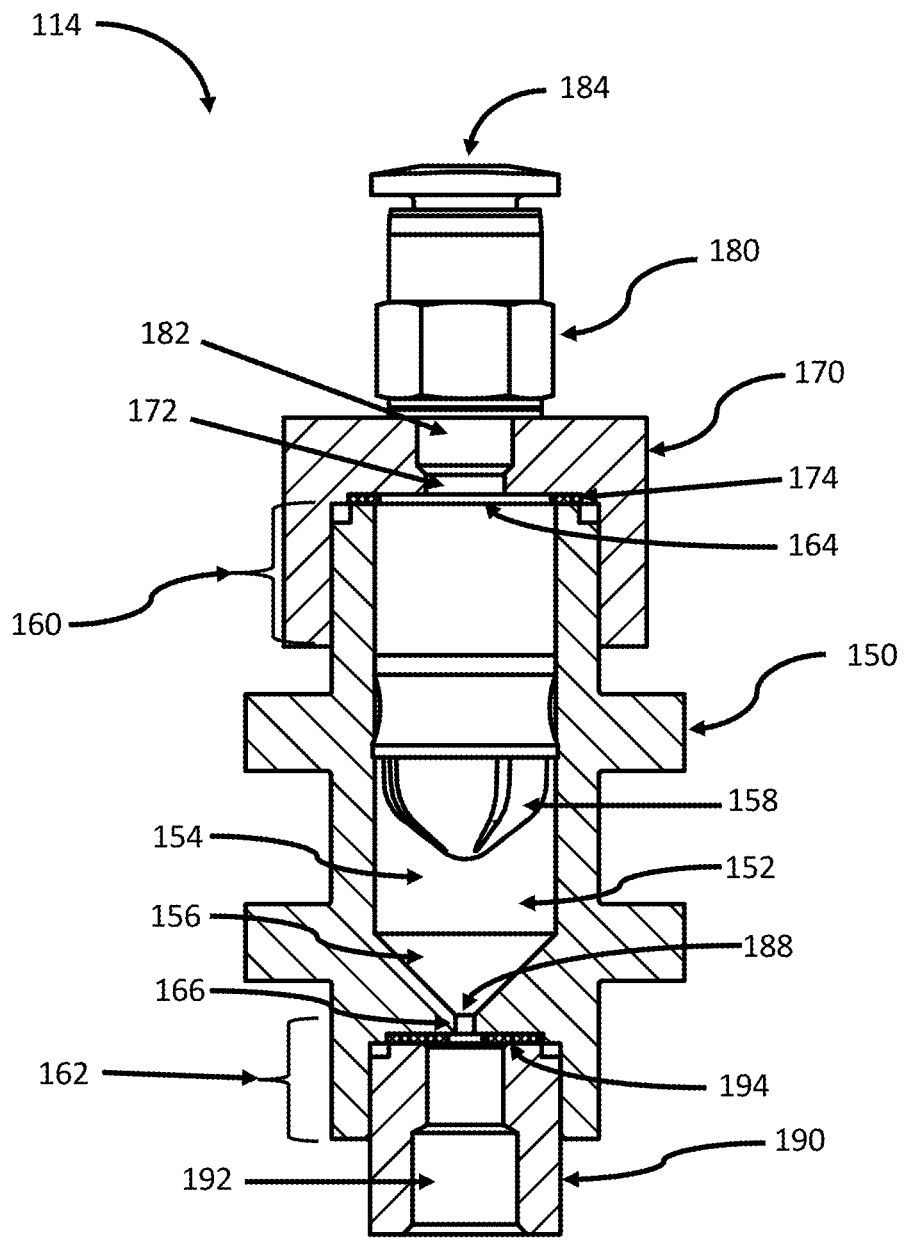
FIG. 8 is a schematic side view and partial cross-sectional view of a piston-cylinder assembly.

At step 14, a piston-cylinder assembly is provided. More generally, the piston-cylinder assembly is sometimes referred to as a printer cartridge. A schematic side view and partial cross-sectional view of an exemplary piston-cylinder assembly 114 is shown in FIG. 8. In the example shown, the piston-cylinder assembly 114 includes a cylinder 150, a cylinder cover 170, a pneumatic connector 180, and an intermediate sealing sleeve 190. The cylinder 150 is shown in cross-section to show a cylindrical cavity portion 154 and a conical cavity portion 156. A piston 158 is located inside cylinder 150. The cylinder 150 has a first end (top end) portion 160 and a second end (bottom end) portion 162 opposite the first end. The cylinder cover 170 is sealably mated to the cylinder 150 at the first end portion 160. In the example shown, an interior surface of the cylinder cover 170 and an exterior surface of the cylinder 150 at its first end portion 160 form a threaded joint. A flat gasket 174 is under compression between the cylinder cover 170 and the cylinder 150 and forms a seal. The intermediate sealing sleeve 190 is sealably mated to the cylinder 150 at the second end portion 162. In the example shown, an exterior surface of the intermediate sealing sleeve 190 and an interior surface of the cylinder 150 at its second end portion 162 form a threaded joint. A flat gasket 194 is under compression between the intermediate sealing sleeve 190 and the cylinder 150 and forms a seal.

The cylinder cover 170 has an opening 172, which retains the pneumatic connector 180. A pneumatic port 184 extends longitudinally through the pneumatic connector 180. The cylinder 150 has a first end 164, in the first end portion 160, and a second end 166, in the second end portion 162. Accordingly, the pneumatic port is at the first end of the cylinder. Air or fluid enters the cylinder from the pneumatic port 184. Inside the cylinder, air or fluid first travels through the cylindrical cavity portion 154 and then a conical cavity portion 156, which tapers to an outlet port 188 at its apex. The outlet port 188 is at the second end 166 opposite the first end 164. The piston 158 is movable in the cylinder 150 between the first end 164 and the second end 166.

Figure 3:
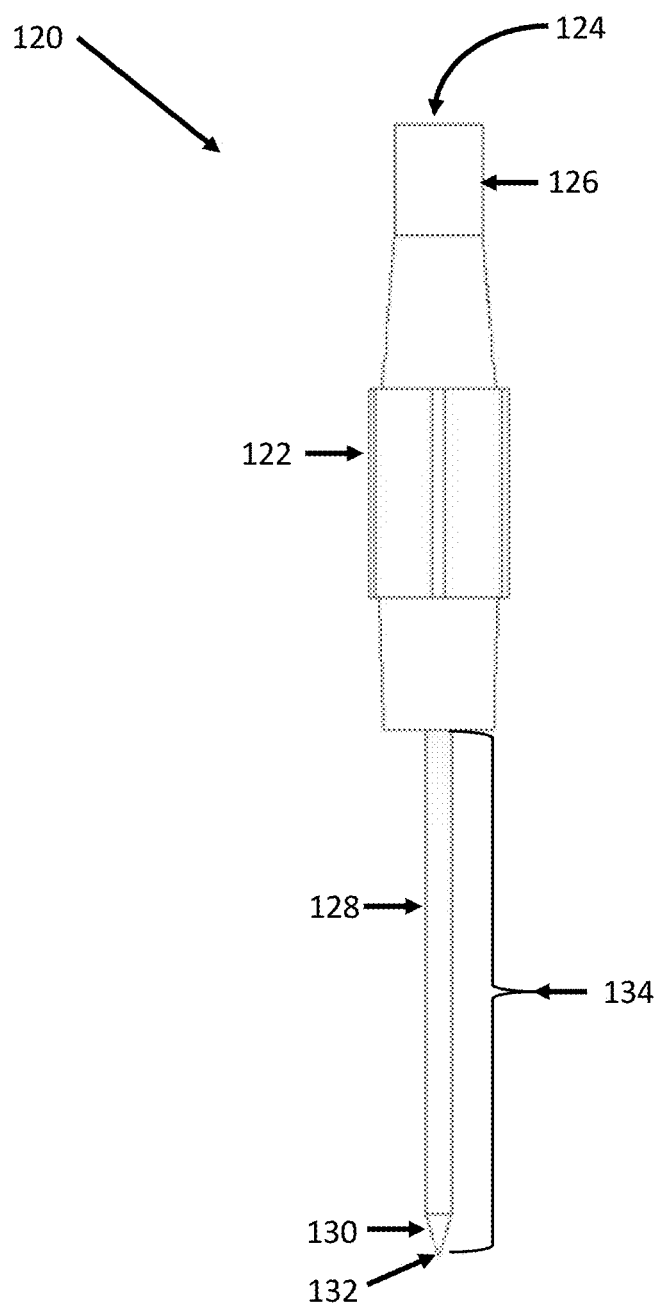
FIG. 3 is a schematic side view of a glass capillary tube.
Figure 9:
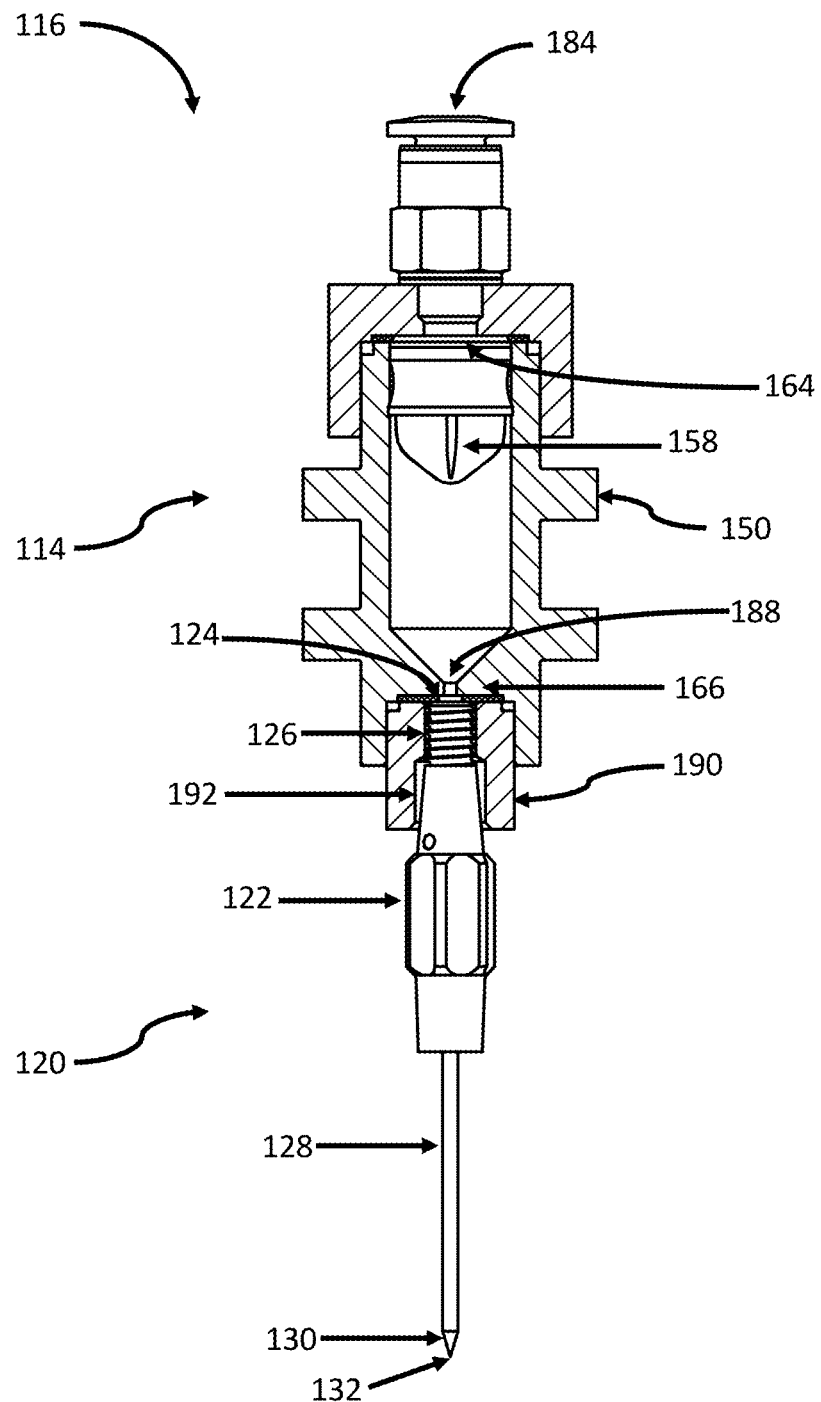
FIG. 9 is a schematic side view and partial cross-sectional view of a metallic nanoparticle composition dispenser.

FIG. 9 is a schematic side view and partial cross-sectional view of a dispenser 116. The dispenser 116 includes a piston-cylinder assembly 114 (FIG. 8) and a capillary tube (nozzle) 120. Capillary tube 120 has a tube inlet 124 and a tube outlet 132. Capillary tube 120 is described in greater detail with reference to FIG. 3. In the example shown, there is a handle 122, including a threaded portion 126, attached to the capillary tube. The threaded portion 126 and an interior surface 192 of the intermediate sealing sleeve 190 form a threaded joint. Accordingly, the intermediate sealing sleeve retains the handle that is attached to the capillary tube. The tube inlet 124 of capillary tube 120 is coupled to the outlet port 188 at the second end 166 of the cylinder 150. At step 14, a capillary tube is installed in the piston-cylinder assembly, to form a dispenser. The dispenser is particularly suited to dispense metallic nanoparticle compositions described herein. Accordingly, the dispenser is sometimes referred to as a metallic nanoparticle composition dispenser.

Commercially available glass capillary tubes can be used in the dispenser. For example, glass capillary tubes (Eppendorf™ Femtotips™ II Microinjection Capillary Tips), having an inner diameter at the tip of 0.5 μm and an outer diameter at the tip of 0.7 □m, are available from Fisher Scientific. A commercially available glass capillary tube 120 is shown schematically in FIG. 3. The glass capillary tube has an inlet 124 at a first end, and outlet 132 at a second end opposite the first end, and an elongate fluid passageway between the inlet 124 and outlet 132. A plastic handle 122 is attached to the glass capillary tube 120 around its circumference. The plastic handle 122 includes an inlet (input end) 124 and a threaded portion 126 near the inlet 124 which enables a threaded connection to an external body or external conduit (see FIG. 9). The inlet 124 has an inner diameter of 1.2 mm.

Figures 4, 5:
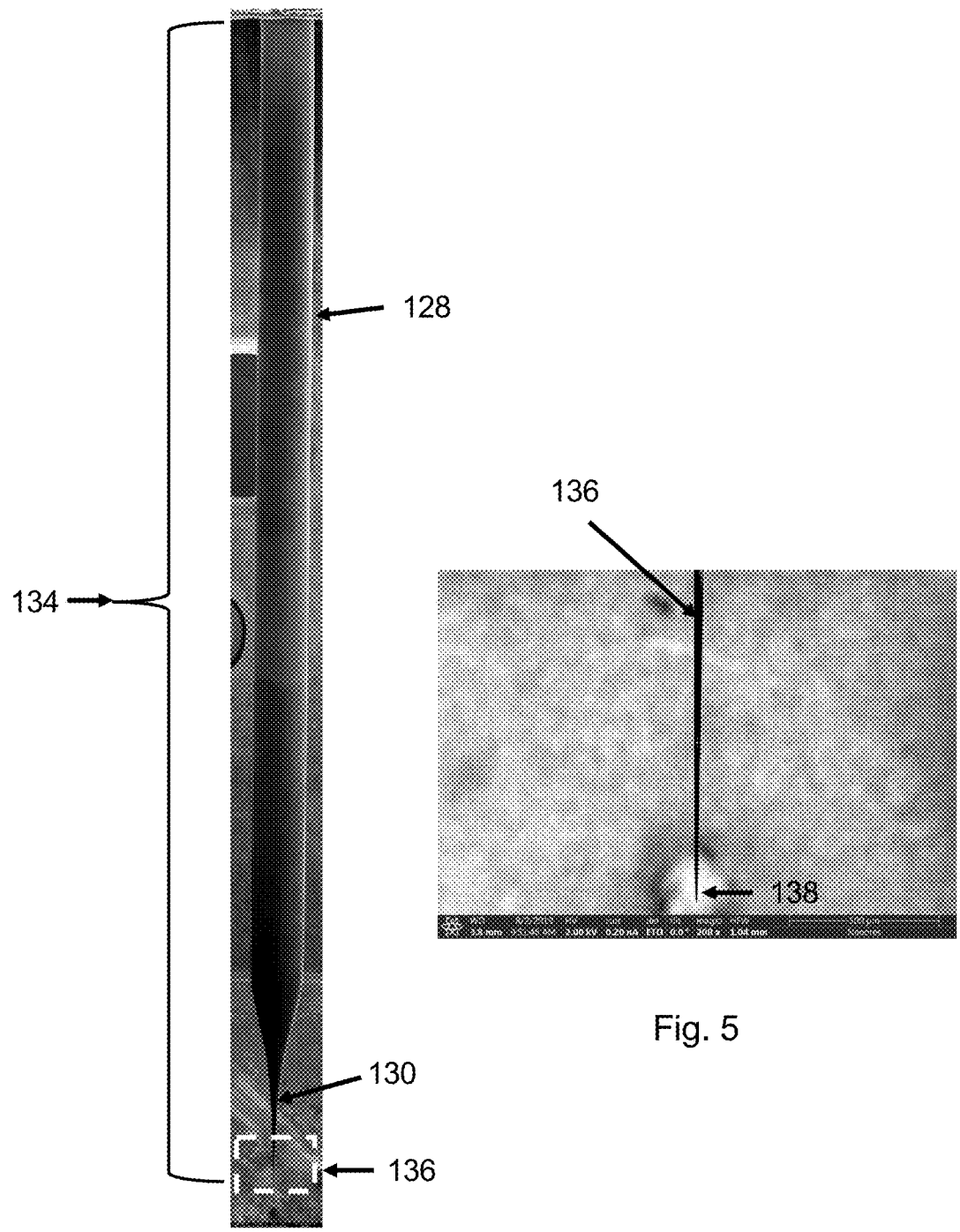
FIG. 4 is a scanning electron microscope (SEM) view of a portion of a glass capillary tube.
FIG. 5 is a scanning electron microscope (SEM) view of a tapering portion of the glass capillary tube, under low magnification.
Figure 6:
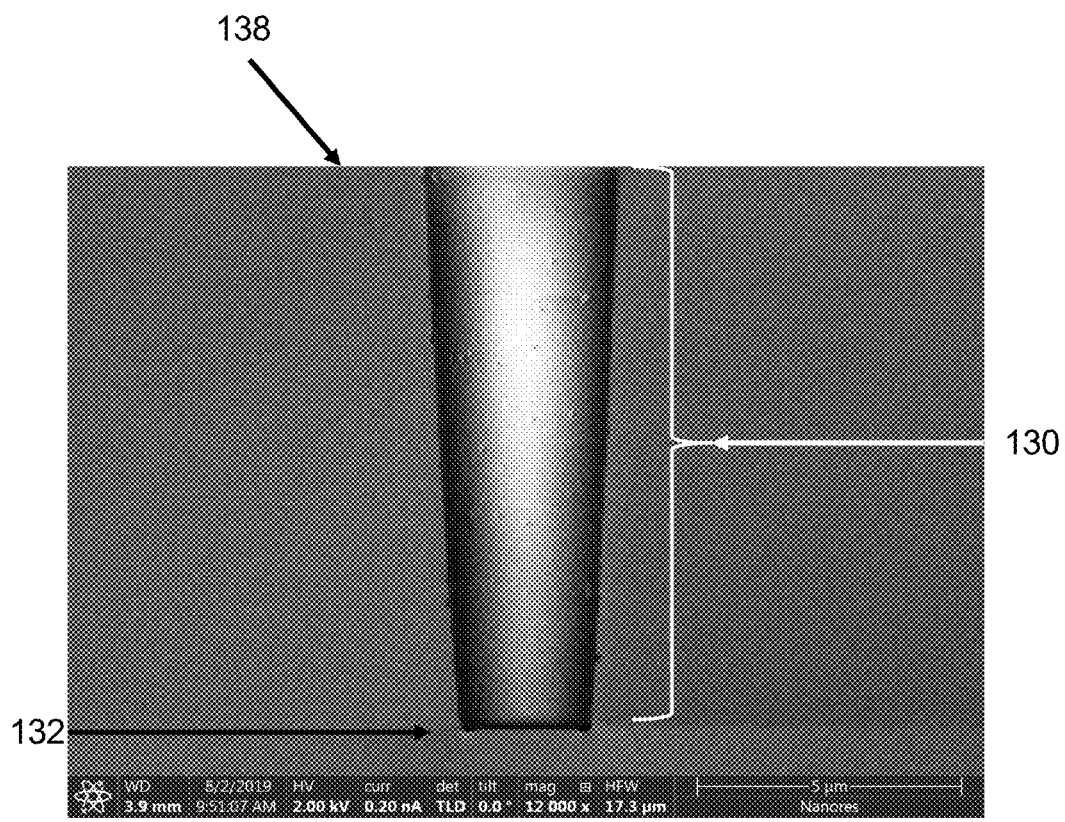
FIG. 6 is a scanning electron microscope (SEM) view of a tapering portion of the glass capillary tube, under high magnification.

The glass capillary tube includes an elongate input portion 128 and a tapering portion 130. There is an externally visible portion 134 of the glass capillary tube 120. Some of the elongate input portion 128 may be obscured by the surrounding plastic handle 122. The tapering portion 130 tapers to an outlet (output end) 132 (having an inner diameter of 0.5 μm and an outer diameter at the tip of 0.7 μm in the case of the certain Femtotips™ II Microinjection Capillary Tips). Stainless-steel capillary tubes can also be used. Stainless-steel capillary tubes with outlet inner diameters of 55 μm and 35 μm have been used. The reduction of diameter along the tapering portion 130 from the elongate input portion 128 to the outlet 132 is more clearly illustrated in FIGS. 4 through 6. FIG. 4 is a scanning electron micrograph view (formed from stitching together multiple SEM images) of the entire externally visible portion 134 of the glass capillary tube 120. A first magnification region 136 of the tapering portion 130 including the outlet 132, observed under low magnification in a scanning electron microscope (SEM), is shown in FIG. 5. Furthermore, a second magnification region 138 located within the first magnification region 136, observed under high magnification in a scanning electron microscope (SEM), is shown in FIG. 6. The outer diameter is smallest at the outlet 132 (FIG. 6) and increases with increasing longitudinal distance from the outlet 132.

Figure 7:
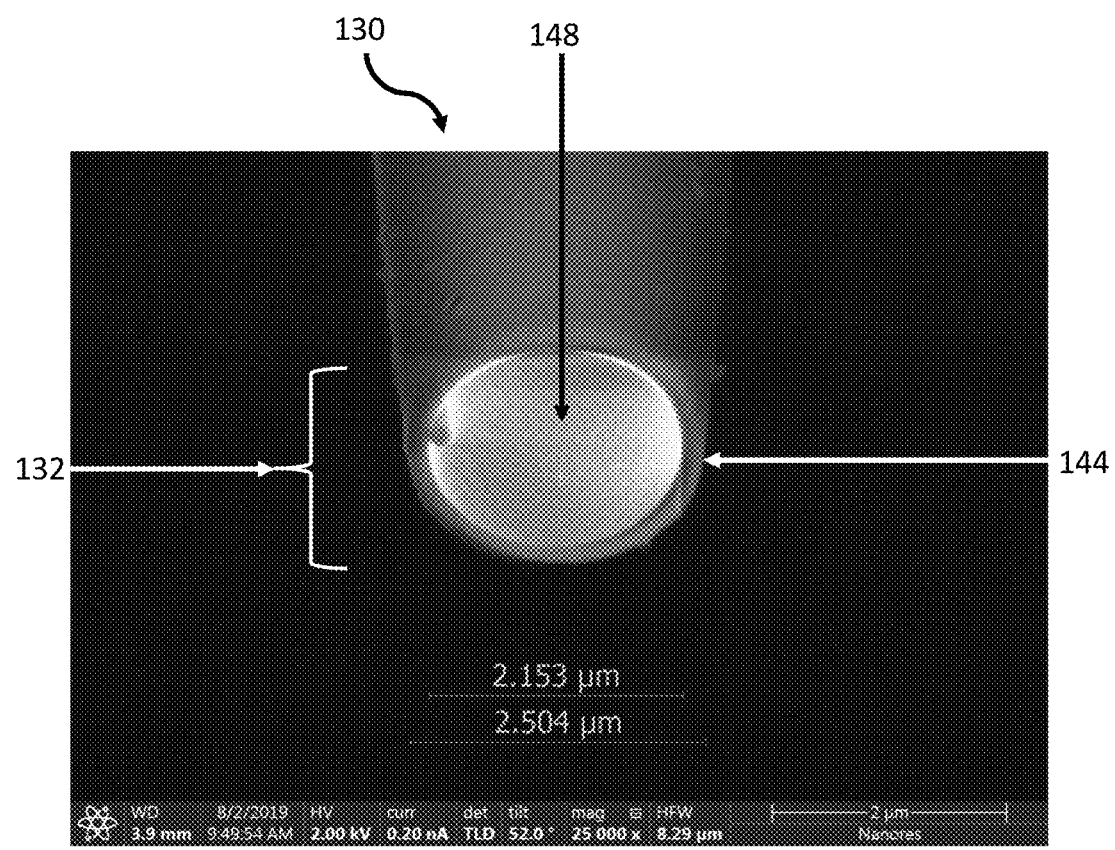
FIG. 7 is a scanning electron microscope (SEM) view of the output portion after focused-ion beam treatment, under high magnification.

In many cases it is desirable to increase the size of the outlet (outlet size). It is possible to increase the outlet size by cutting the glass capillary tube 120 at a suitable longitudinal location along the tapering portion 130. Cutting may be done using a focused-ion beam (FIB) apparatus. For example, a plasma-source Xe⁺ FIB (also called PFIB) is used. The capillary tube is installed in the FIB apparatus. A longitudinal location along the tapering portion 130 is selected, and the focused ion beam is directed to it, with sufficient energy density for cutting the glass tube. A cut is made using the focused-ion beam across the tapering portion at the selected longitudinal location. A scanning electron microscope (in the FIB apparatus) is used to measure the outer diameter or inner diameter or both at the tip. If the measured inner diameter or outer diameter or both are too small, the cutting is carried out at another longitudinal location along the tapering portion. In the example shown in FIG. 7, the outlet inner diameter is measured to be 2.153 μm and the outlet outer diameter is measured to be 2.504 μm. We refer to the outlet outer diameter as the outlet size. For glass capillary tubes 120, outlet sizes in a range of 0.7 μm to 8 μm are possible and have been tried.

At step 14, the metallic nanoparticle composition is injected into the cylinder 150. In the case of the piston-cylinder assembly shown in FIG. 8, this can be accomplished by injecting the metallic nanoparticle composition into the cylinder 150 via its first end 164 using a syringe, with the piston 158 removed from the cylinder and the cover 170 and the pneumatic connector 180 detached from the cylinder 150. Subsequently, the piston is positioned in the cylinder. Additionally, in the example shown in FIG. 8, the cylinder cover 170 and the pneumatic connector 180 are attached to the cylinder 150 at step 14. The pneumatic port 184 is coupled to a regulated pneumatic system 106 via tubing 107.

Figure 10:
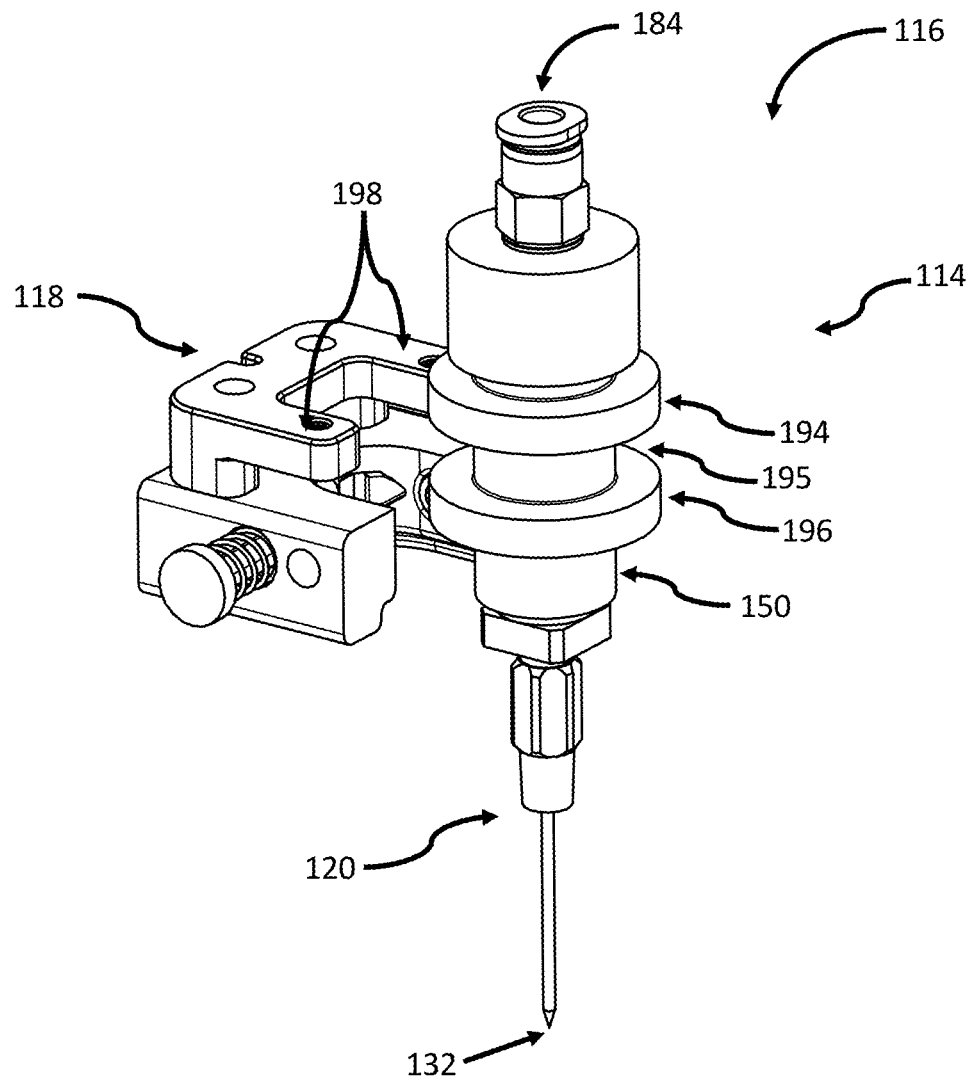
FIG. 10 is a schematic perspective view of a metallic nanoparticle composition dispenser and an associated dispenser holder.

FIG. 10 is a schematic perspective view of a metallic nanoparticle composition dispenser 116 and an associated dispenser holder 118. The dispenser holder 118 includes a fork 198. When assembled, the fork is inserted into a groove 195 between two annular protrusions 194, 196 that protrude radially outward from the outer walls of the cylinder 150. Accordingly, the dispenser holder 118 retains the dispenser. The dispenser holder 118 is mechanically coupled to the print head positioning system 108. At step 14, the dispenser 116 is installed in the dispenser holder 118.

As shown in FIG. 2, the imaging system 109 captures images of the capillary tube outlet 132 and a portion of the substrate's printable surface 112 near the capillary tube outlet 132. The imaging system 109 is used to monitor a vertical distance (height) between the capillary tube outlet 132 and a surface on which the metallic nanoparticle composition is dispensed, such as the printable surface 112 of the substrate 110. The print head positioning system 108 controls the vertical displacement of the print head 104 and the lateral displacement of the print head 104 relative to the substrate.

According to method 10, a metallic nanoparticle composition dispenser 116 including a piston-cylinder assembly is preferably used to dispense the metallic nanoparticle composition. According to this method, regulated pressure is applied to a piston in the piston-cylinder assembly, and the piston extrudes the metallic nanoparticle composition. The extrusion relies solely on the applied pressure; the dispensing (extruding) is carried out without the application of electric fields to the nanoparticle composition. As the metallic nanoparticle composition is highly viscous, the composition is extruded to a filament and no liquid droplets are formed.

The print head positioning system 108 controls the vertical displacement of the print head 104 and the lateral displacement of the print head 104 relative to the substrate. During dispensing of the metallic nanoparticle composition onto the substrate, the print head 104 is moved laterally and/or vertically. In the examples shown in FIG. 2, the capillary tube is held at a vertical orientation during the dispensing of the metallic nanoparticle composition onto the substrate. In other examples, the capillary tube can be tilted, such that the dispenser 116 travels ahead of the capillary tube outlet during the lateral displacement. During dispensing, the print head positioning system 108 maintains a vertical distance between the nozzle outlet and the surface (the surface on which the composition is being dispensed) in a range of approximately 1 and 10

Figure 11:
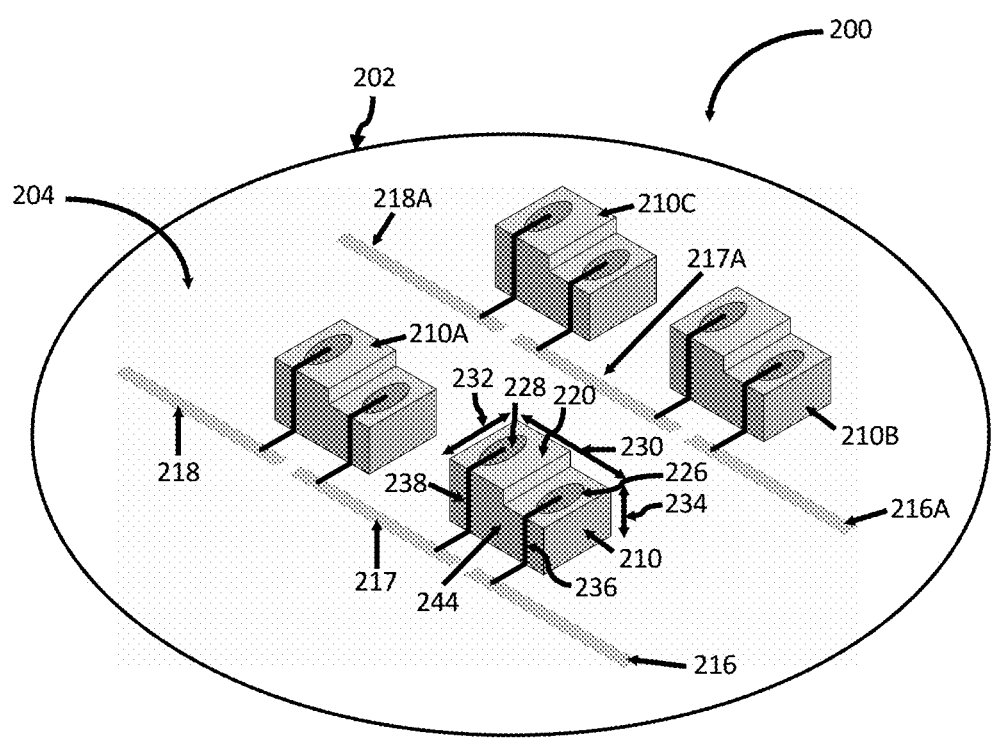
FIG. 11 is a schematic perspective view of a light-emitting assembly, including an array of light-emitting diodes (LEDs) on a substrate.

FIG. 11 is a schematic perspective view of a light-emitting assembly 200 according to a preferred embodiment. In the example shown, the light-emitting assembly 200 includes a substrate 202, conductive traces (216, 217, 218, 216A, 217A, and 218A), and light-emitting diodes (LEDs) (210, 210A, 210B, and 210C). In the example shown, LEDs 210 and 210A are connected in series, and LEDs 210B and 210C are connected in series. In the example shown in FIG. 11, the conductive traces and the LEDs are on the substrate. In other examples, the LEDs and/or the conductive traces can be in the substrate. Each LED (e.g., 210) has a respective top portion (e.g., 220) facing upwards (facing away from substrate 202). In LED 210, the top portion 220 is the light-emitting surface. Each LED (e.g., 210) has a respective first electrode (e.g., cathode or n-electrode) (e.g., 226) and a respective second electrode (e.g., anode or p-electrode) (228). In the example shown, the first electrodes and second electrodes are formed in the respective top portions, facing away from the substrate. In the example shown, the first electrode (e.g., 226) is shown to be at a greater height than the second electrode (e.g., 228) because of the intervening multiple quantum wells.

FIG. 11 shows a light-emitting assembly including four LEDs. However, a light-emitting assembly can have any number of LEDs. For example, a flat-panel display can be formed from an array of micro-LEDs numbering more than one million. Micro-LEDs are microscopic LEDs having lateral dimensions of 200 μm or less. Lateral dimensions 230, 232 are shown for LED 210. Additionally, vertical dimension or height 234 is shown for LED 210. In the example of LED 210 (FIG. 11), a lateral dimension (length) 230 can be approximately 150 μm, another lateral dimension (width) 232 can be approximately 90 μm, and a vertical dimension (height) can be approximately 80 μm. Elongate electrical connection features (236, 238) extend between the respective electrode (226, 228) and conductive traces (216, 217) of LED 210.

Figure 12:
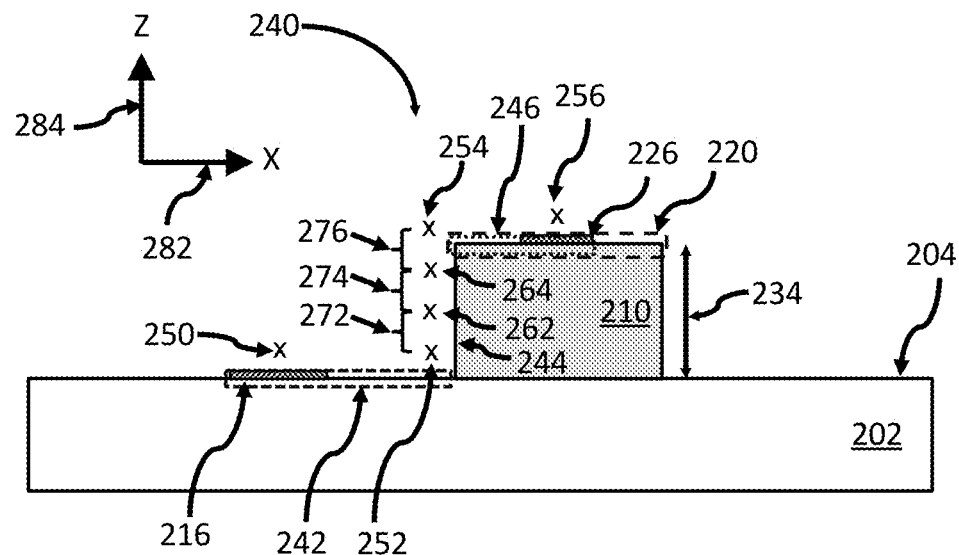
FIG. 12 is a schematic side view of a solid-state light-emitting element on a substrate.
Figure 13:
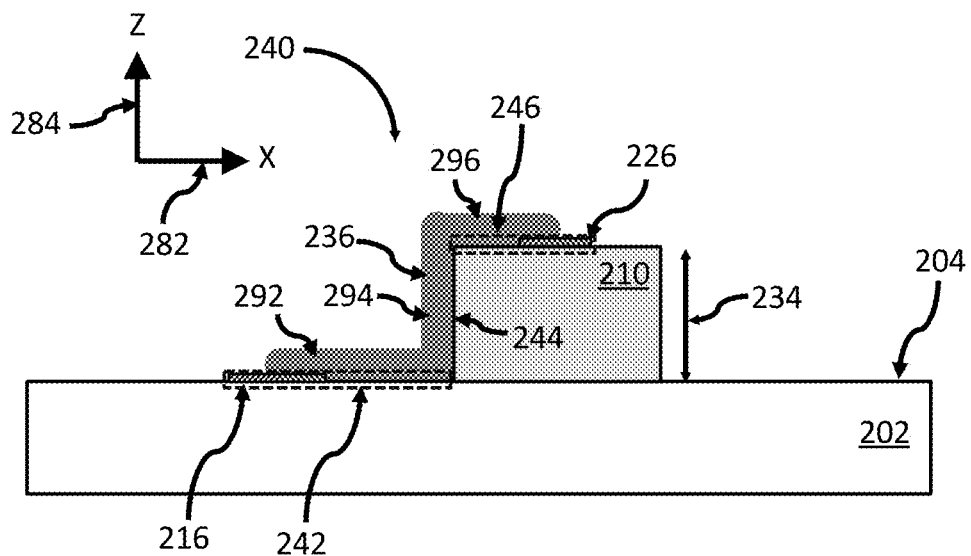
FIG. 13 is a schematic side view of a solid-state light-emitting element on a substrate, with an elongate electrical connection feature.

FIG. 12 is a schematic side view of a solid-state light-emitting element 210 mounted on a printable surface 204 of a substrate 202. Examples of solid-state light-emitting elements are light-emitting diodes (LEDs) and laser diodes (LDs). A microscopic step 240 has a height 234 of at least 10 μm, or at least 30 μm, or at least 100 μm, between a step bottom portion 242, at the printable surface 204, and a step top portion 246 at a top portion 230 of the light-emitting element 210. At step 16 (FIG. 1), the capillary tube 120 (nozzle) is displaced to a first position 250. First position 250 is at the conductive trace 216. At step 18, the capillary tube is displaced from the first position 250 to a second position 252. The first position 250 and the second position 252 are at the step bottom portion 242. In the example shown, the second position 252 is closer to the sidewall 244 of microscopic step 240 than the first position 250. In this example, sidewall 244 is a sidewall of the light-emitting element 210. At step 18, the metallic nanoparticle composition is continuously extruded from the capillary tube while the capillary tube is displaced relative to the substrate from the first position 250 to the second position 252. The displacing during step 18 is predominantly lateral (predominantly along X-direction 282). During this step 18, the extruded metallic nanoparticle composition overlies and contacts the step bottom portion. This extruded composition corresponds to a first portion 292 of the elongate electrical connection feature 236 (FIG. 13).

In the foregoing, first position 250 and second position 252 refer to positions of the outlet 132 of the capillary tube 120. Typically, the outlet 132 contacts neither the step bottom portion 242 nor the conductive trace 216. Preferably, the outlet 132 is at a height in a range of 1 μm to 10 μm above the surface (e.g., step bottom portion 242 and/or conductive trace 216 during step 18 and step top portion 246 and/or electrode 226 during step 28) on which metallic nanoparticle composition is dispensed. For example, the statement that "the first position 250 is at the conductive trace 216" means that a lateral position of the capillary tube outlet 132 is at the conductive trace 216 and the capillary tube outlet 132 is positioned above the conductive trace 216.

At step 20, the capillary tube is displaced from the second position 252 to a third position 254. The third position 254 is at a height not lower than the step top portion 246. At step 20, the metallic nanoparticle composition is extruded from the capillary tube while the capillary tube is displaced relative to the substrate from the second position 252 to the third position 254. During this step 20, the extruded metallic nanoparticle composition extends between the step bottom portion 242 and the step top portion 246 and contacts the sidewall 244. This extruded composition corresponds to a second portion 294 of the elongate electrical connection feature 236 (FIG. 13). Preferably, the displacing from second position 252 to third position 254 is predominantly vertical (predominantly along Y-direction 284). The second position 252 and the third position 254 should be sufficiently close to the sidewall 244 such that the extruded composition contacts the sidewall 244. The capillary tube 120 can contact the sidewall 244 during step 20.

Step 20 includes sub-steps 22, 24, and 26. While FIG. 1 shows sub-step 24 being executed after sub-step 22, the order of these sub-steps can be reversed in some cases. At sub-step 22, the metallic nanoparticle composition is continuously extruded from the capillary tube while the capillary tube is displaced by a height increment during a displacement period $T_{move}$. At sub-step 24, the metallic nanoparticle composition is continuously extruded from the capillary tube while the capillary tube is stationary during a stationary period $T_{wait}$. Accordingly, the capillary tube is moving during displacement period $T_{move}$ and is stationary during stationary period $T_{wait}$. Sub-steps 22 and 24 are repeated until the capillary tube reaches the third position 254 (decision sub-step 26). Preferably, the height increment is in a range of 1 µm to 10 µm. The method enables conductive features that traverse microscopic steps wherein the height of the microscopic step is at least 10 µm, or at least at least 30 µm, or at least at least 100 µm. If the height increment is smaller than 1 µm, the total time required to carry out the method may be too long. If the height increment is greater than 10 µm, the conductive feature may become discontinuous. Preferably, the stationary period $T_{wait}$ is at least three times the displacement period $T_{move}$. Preferably, the stationary period $T_{wait}$ is at least 10 milliseconds.

In the specific example shown in FIG. 12, step 20 is carried out as follows: (1) the metallic nanoparticle composition (composition) is continuously extruded from the capillary tube while the capillary tube is raised by height increment 272 from second position 252 to first intermediate position 262, during a displacement period $T_{move1}$; (2) the composition is continuously extruded from the capillary tube while the capillary tube is stationary (at first intermediate position 262) during a stationary period $T_{wait1}$; (3) the composition is continuously extruded from the capillary tube while the capillary tube is raised by height increment 274 from first intermediate position 262 to second intermediate position 264, during a displacement period $T_{move2}$; (4) the composition is continuously extruded from the capillary tube while the capillary tube is stationary (at second intermediate position 264) during a stationary period $T_{wait2}$; (5) the composition is continuously extruded from the capillary tube while the capillary tube is raised by height increment 276 from second intermediate position 264 to third position 254, during a displacement period $T_{move3}$; (6) the composition is continuously extruded from the capillary tube while the capillary tube is stationary (at third position 254) during a stationary period $T_{wait3}$.

At step 28, the capillary tube is displaced from the third position 254 to a fourth position 256. The fourth position 256 is at the step top portion 246. Fourth position 256 is at the electrode 226. In the example shown, the third position 254 is closer to the sidewall 244 than the fourth position 256. At step 28, the metallic nanoparticle composition is continuously extruded from the capillary tube while the capillary tube is displaced relative to the substrate from the third position 254 to the fourth position 256. The displacing during step 28 is predominantly lateral (predominantly along X-direction 282). During this step 18, the extruded metallic nanoparticle composition overlies and contacts the step top portion. This extruded composition corresponds to a third portion 296 of the elongate electrical connection feature 236 (FIG. 13). The steps 18, 20, and 28 can be repeated at the respective conductive traces and electrodes of a light-emitting assembly 200.

At step 18, the first portion 292 of the elongate electrical connection feature 236 is formed (FIG. 13). The first portion 292 overlies and contacts the step bottom portion 242 and is connected to the conductive trace 216. At step 20, the second portion 294 of the elongate electrical connection feature 236 is formed. The second portion 294 extends between the step bottom portion 242 and the step top portion 246 and contacts a sidewall 244 of the microscopic step 240. In the example shown, this sidewall is a sidewall of the light-emitting element 210. At step 28, the third portion 296 of the elongate electrical connection feature 236 is formed. The third portion 296 overlies and contacts the step top portion 246 and is connected to the electrode 226.

At step 30, the workpiece is sintered. The workpiece includes the substrate, the conductive feature, and any other existing features on the substrate. In the example shown in FIGS. 11, 12, and 13, the existing features include the conductive traces and the solid-state light-emitting elements. The workpiece can be sintered in an atmosphere of air or in a protective atmosphere. Examples of protective atmospheres are: Argon, Nitrogen, and a mixture of Hydrogen (5 vol. %) and Nitrogen (95 vol. %). The workpiece can be sintered at a temperature of 140° C. or lower. Photonic sintering can also be used. Photonic sintering can be carried out using a laser or a flash lamp. If a laser is used, emission wavelengths of 1064 nm, 532 nm, and 450 nm have been effective. The laser can be operated in continuous-wave mode or pulsed mode. In the example shown in FIG. 11, each conductive feature (e.g., 236, 238) is formed at a respective LED (210, 210A, 210B, 210C) according to steps 16, 18, 20, and 28. Subsequently, the workpiece undergoes step 30 (sintering).

FIG. 13 is a schematic side view of a solid-state light-emitting element on a substrate, after formation of an elongate electrical connection feature (conductive feature) 236 according to method 10. Conductive feature 236 traverses microscopic step 240 on substrate 202. Conductive feature 236 includes a first portion 292, a second portion 294, and a third portion 296. The second portion 294 is connected to the first portion 292 and the third portion 296. The first portion, the second portion, and the third portion include metallic nanoparticles. Preferably, the first portion 292 and the third portion 296 extend predominantly in lateral directions (e.g., direction 282) and the second portion 294 extends predominantly in a vertical direction (e.g., direction 284). Preferably, the first portion 292 follows a contour of the step bottom portion 242, the second portion 294 follows a contour of the sidewall 244, and the third portion follows a contour of the step top portion 296. At least one of the first portion, the second portion, and the third portion is characterized by a line width in a range of 2 µm to 30 µm. Method 10 enables traversing relatively large steps (step heights of 10 µm, or 30 µm, or 100 µm) using relatively compact conductive features (line widths of 2 µm to 30 µm).

Figure 14:
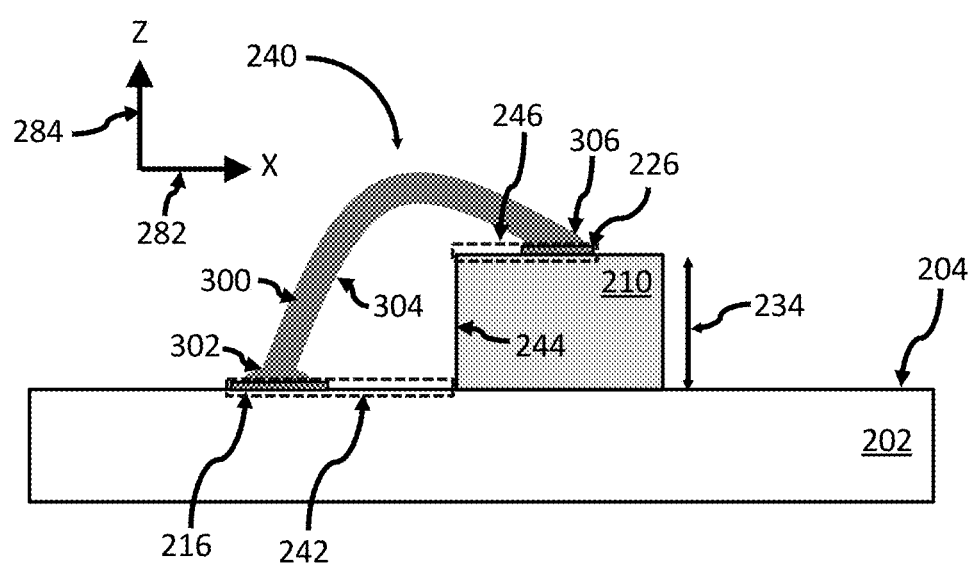
FIG. 14 is a schematic side view of a solid-state light-emitting element on a substrate, with a conventional wire-bond electrical connection.

The elongate electrical connection feature (FIG. 13) can be compared to a conventional wire-bond connection as illustrated in FIG. 14. FIG. 14 is a schematic side view of a solid-state light-emitting element on a substrate, with a conventional wire-bond electrical connection 300. The light-emitting element, substrate, and conductive trace are similar to that shown in FIG. 13. The wire-bond connection 300 includes a wire 304 extending in space between the conductive trace 216 and the electrode 226. The wire-bond connection includes a bond 302 which connects to the conductive trace 216 and another bond 306 which connects to the electrode 226. A diameter of the wire 304 is typically greater than 15 µm. The wire 304 does not contact the sidewall 244. The conductive feature 236 (FIG. 13) follows the contour of and contacts the step bottom portion 242, the sidewall 244, and step top portion 246. Therefore, the conductive feature 236 is mechanically more stable than wire 304. It is easier to deposit materials after formation of the conductive feature 236 than after formation of a wire-bond connection 300. The fact that there is no wire suspended in space facilitates further miniaturization. When a wire-bond connection is formed to an electrode located at a light-emitting surface, the wire-bond connection can block some of the light emission. This effect becomes more pronounced for micro-LEDs, which are LEDs having lateral dimensions of 200 µm or less. The conductive feature 236 can be of smaller line widths (as small as 2 µm) compared to wire bond connections (15 µm and greater).

Figure 15:
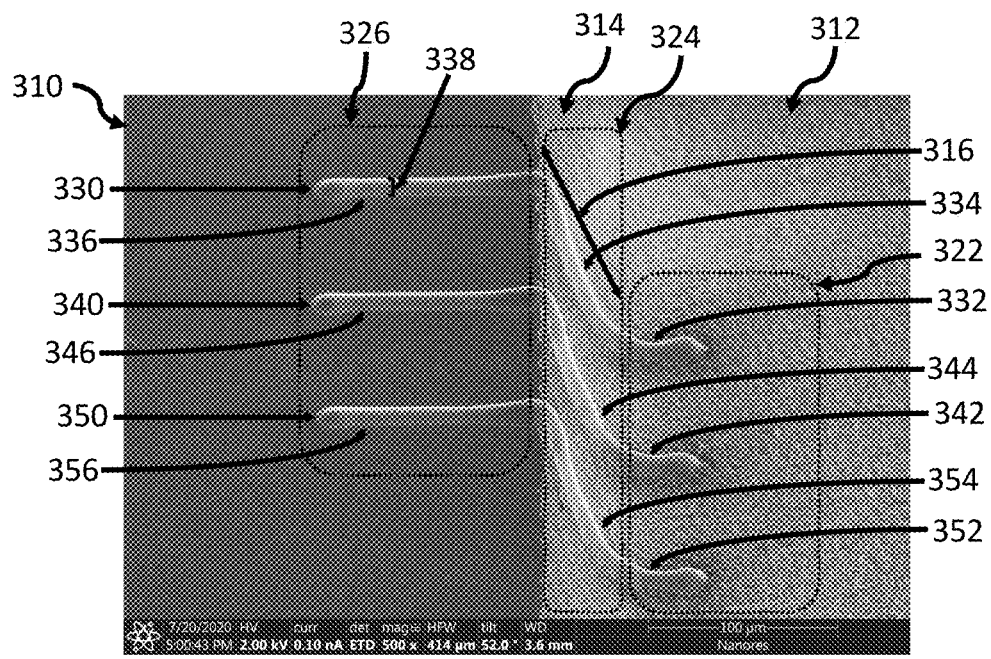
FIG. 15 is a scanning electron microscope (SEM) view of elongate electrical connection features formed traversing a microscopic step in a substrate.

FIG. 15 is a perspective view (SEM image) of three elongate electrical connection features traversing a microscopic step in a substrate. There is a recess 312 formed into a glass substrate 310. There is a microscopic step 314 having a step height (316) of approximately 150 µm. Method 10 was carried out to form three elongate electrical connection features (330, 340, 350). Each conductive feature (330, 340, 350) includes a respective first portion (332, 342, 352) overlying and contacting the step bottom portion 322, a respective second portion (334, 344, 354) extending between the step bottom portion 322 and the step top portion 326 and contacting the sidewall 324, and a respective third portion (336, 346, 356) overlying and contacting the step top portion 326. The first portions (332, 342, 352) and the third portions (336, 346, 356) extend predominantly in lateral directions and the second portions (334, 344, 354) extend predominantly in a vertical direction. A metallic nanoparticle composition according to Example 1 was used. A line width 338 of the third portion 336 was approximately 15 µm. The applied pressure during extrusion (steps 18, 20, 28) was 9 bar. The outlet size (outer diameter of the outlet) of the capillary tube used was 8 µm. At step 20, the height increment was approximately 1 µm, the displacement period was approximately 25 milliseconds, and the stationary period was 100 milliseconds.

Figure 16:
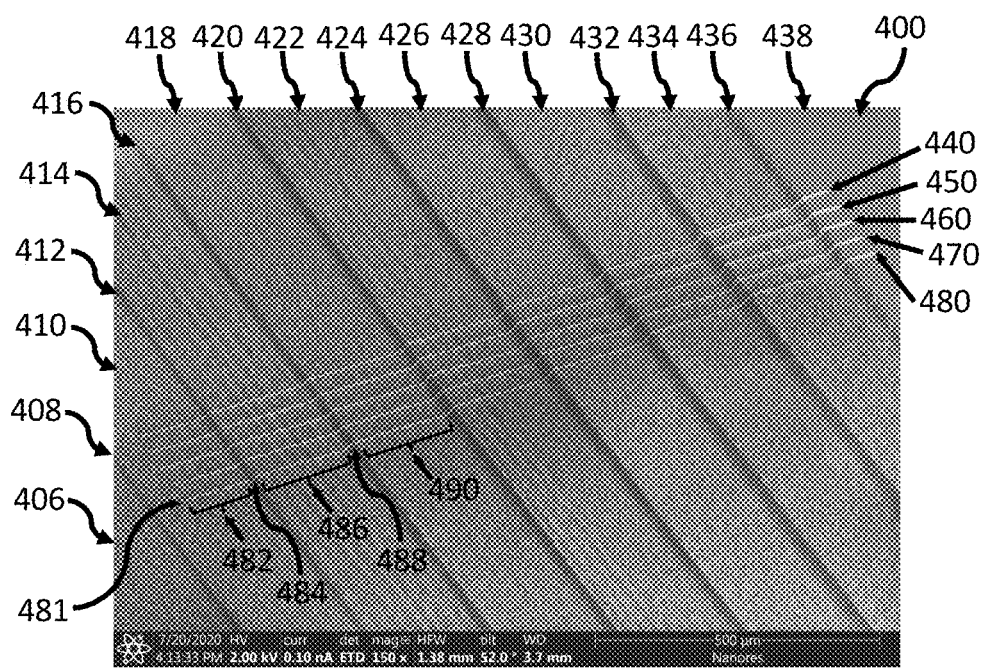
FIG. 16 is a scanning electron microscope (SEM) view of elongate electrical connection features formed traversing multiple microscopic steps in a substrate.

FIG. 16 is a perspective view (SEM image) of five elongate electrical connection features traversing seven microscopic steps in a substrate. There are recesses formed into a glass substrate 400, resulting in a series of microscopic steps (408, 412, 416, 420, 424, 428, 432, 436). Each microscopic step has a step height of approximately 15 µm. Each microscopic step is located between a bottom plateau (step bottom portion) and a top plateau (step top portion). Method 10 was carried out to form five elongate electrical connection features (440, 450, 460, 470, 480) each traversing seven microscopic steps (412, 416, 420, 424, 428, 432, 436). Consider the implementation of method 10 as applied to conductive feature 480. First, steps 12 and 14 are carried out. At step 16, the capillary tube is displaced to a first position 481, located at a bottom plateau (410) of the bottommost microscopic step 412. Step 18 results in the formation of portion 482 overlying and contacting plateau (step bottom portion) 410. Step 20 results in the formation of portion 484 contacting a sidewall of the microscopic step 412. Step 28 results in the formation of portion 486 overlying and contacting plateau (step top portion) 414. Next, in order to traverse the next microscopic step 416, step 20 is repeated, provided that plateau 414 is now the step bottom portion and plateau 418 is now the step top portion. This results in the formation of portion 488 contacting a sidewall of the microscopic step 416. Next step 28 is repeated, resulting in the formation of portion 490 overlying and contacting plateau (step top portion) 418. Steps 20 and 28 are repeated until the topmost microscopic step 436 has been traversed. A metallic nanoparticle composition according to Example 1 was used. The line widths of the conductive features was approximately 4 µm. A length of each conductive feature was approximately 200 µm. The total height traversed over the seven microscopic steps was approximately 105 µm. The applied pressure during extrusion (steps 18, 20, 28) was 9 bar. The outlet size (outer diameter of the outlet) of the capillary tube used was approximately 5 µm. At step 20, the height increment was approximately 1 µm, the displacement period was approximately 25 milliseconds, and the stationary period was 100 milliseconds.

EXAMPLES

Example 1

Silver Nanoparticle Paste Composition (85 wt %) in Triethylene Glycol, including Dispersing Agent 2 wt %

Reagents:
$AgNO_3$-12.5 g
PVP (K30 grade)-100.1 g
Ethylene glycol-560 ml
Acetone-1520 ml
Ethanol 96%-300 ml
Triethylene glycol-1.326 ml
Dispersing agent, alkylammonium salt of a copolymer with acidic groups-235.2 µl 1) Synthesis. Two synthesis reactions were done in parallel. For each synthesis reaction: $AgNO_3$ (12.5 g) was dissolved in 50 ml of Ethylene Glycol at room temperature. In a three-necked flask, PVP (100.2 g) was dissolved in 250 ml of Ethylene Glycol, under reflux, while heating at 140° C. $AgNO_3$ solution was poured in a quick movement (via funnel) into hot PVP dissolved in Ethylene Glycol. Mixtures were heated at 140° C. for 60 min under vigorous stirring. Finally, cooled in cold water bath until room temperature was reached.

2) Purification. Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag NPs suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet were individually re-dispersed in premixtures of 30 ml EtOH and 58.8 µl dispersing agent (for each of 4 bottles of the double synthesis) under sonication and shaking (10 min).

3) Formulation. Approximately 120 ml of obtained dispersion were transferred into a syringe and filtered through 1.0 µm PA filter directly into round-bottom flask. 1.326 ml of triethylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 µm PVDF filter directly into 5 ml PE syringe (filled from top). Obtained dispersion is estimated to have a solid content concentration of 85 wt %±2 wt % (based on TGA measurement). Silver content is estimated to be in a range of 79 wt % to 83 wt % (based on ICP or AAS measurement). The concentration of the dispersing agent in the composition is estimated to be approximately 2 wt %.

What is claimed is:

1. A method of forming an elongate electrical connection feature traversing at least one microscopic step on or in a substrate, comprising the steps of:
   (A) continuously extruding a metallic nanoparticle composition from a capillary tube while displacing the capillary tube relative to the substrate from a first position to a second position, the first position and the second position being at a step bottom portion, the displacing being predominantly lateral, the extruded metallic nanoparticle composition overlying and contacting the step bottom portion;
   (B) extruding the metallic nanoparticle composition from the capillary tube while displacing the capillary tube relative to the substrate from the second position to a third position, the third position being at a height not lower than a step top portion, the extruded metallic nanoparticle composition extending between the step bottom portion and the step top portion and contacting a sidewall of the at least one microscopic step; and
   (C) continuously extruding the metallic nanoparticle composition from the capillary tube while displacing the capillary tube relative to the substrate from the third position to a fourth position, the fourth position being at a step top portion, the displacing being predominantly lateral, the extruded metallic nanoparticle composition overlying and contacting the step top portion;
   wherein the step (B) of extruding the metallic nanoparticle composition comprises the sub-steps of:
   (B1) continuously extruding the metallic nanoparticle composition from the capillary tube while raising the capillary tube by a height increment during a displacement period;
   (B2) continuously extruding the metallic nanoparticle composition from the capillary tube while the capillary tube is stationary during a stationary period; and
   (B3) repeatedly executing sub-steps (B1) and (B2) until the capillary tube reaches the third position.

2. The method of claim 1, wherein the second position is closer to the sidewall than the first position.

3. The method of claim 1, wherein the third position is closer to the sidewall than the fourth position.

4. The method of claim 1, wherein a concentration of metallic nanoparticles in the metallic nanoparticle composition is 80 wt % or greater.

5. The method of claim 1, wherein the metallic nanoparticle composition comprises silver nanoparticles.

6. The method of claim 1, wherein the metallic nanoparticle composition comprises triethylene glycol, and a concentration, in aggregate, of solvents having a boiling point of less than 280° C. at a pressure of 760 mm Hg in the metallic nanoparticle composition does not exceed 3 wt %.

7. The method of claim 1, additionally comprising a step of:
   (D) sintering a workpiece including the substrate and the elongate electrical connection feature.

8. The method of claim 1, wherein an output diameter of the capillary tube is in a range of 0.7 µm to 8 µm.

9. The method of claim 1, wherein a height of the microscopic step is at least 10 µm.

10. The method of claim 9, wherein the height is at least 30 µm.

11. The method of claim 10, wherein the height is at least 100 µm.

12. The method of claim 1, wherein the stationary period is at least three times the displacement period.

13. The method of claim 1, wherein the stationary period is at least 10 milliseconds.

14. The method of claim 1, wherein the height increment is in a range of 0.1 µm to 20 µm.

15. The method of claim 14, wherein the height increment is in a range of 1 µm to 10 µm.

16. The method of claim 1, wherein:
   the capillary tube does not contact the step bottom portion during step (A); and the
   capillary tube does not contact the step top portion during step (C).

17. The method of claim 1, wherein the displacing at step (B) is predominantly vertical.

18. The method of claim 1, wherein the elongate electrical connection feature is characterized by a line width in a range of 2 µm to 30 µm.

19. The method of claim 1, wherein:
   the at least one microscopic step is between an electrode of a solid-state light-emitting element on or in a substrate and a conductive trace on or in the substrate;
   the first position is at the conductive trace; and the fourth position is at the electrode.

* * * * *